US006915478B2

(12) United States Patent
Cox

(10) Patent No.: US 6,915,478 B2
(45) Date of Patent: Jul. 5, 2005

(54) METHOD AND APPARATUS FOR COMPUTING REED-SOLOMON ERROR MAGNITUDES

(75) Inventor: Darrell K Cox, Denison, TX (US)

(73) Assignee: Texas Instruments Incorporated, Dallas, TX (US)

( * ) Notice: Subject to any disclaimer, the term of this patent is extended or adjusted under 35 U.S.C. 154(b) by 497 days.

(21) Appl. No.: 10/026,342

(22) Filed: Dec. 21, 2001

(65) Prior Publication Data

US 2003/0126542 A1 Jul. 3, 2003

(51) Int. Cl.[7] .......... H03M 13/15
(52) U.S. Cl. .......... 714/784
(58) Field of Search .......... 714/784, 748; H03M 13/15

(56) References Cited

U.S. PATENT DOCUMENTS 4,665,523 A * 5/1987 Citron et al. .......... 714/785
6,012,159 A * 1/2000 Fischer et al. .......... 714/755
6,131,178 A * 10/2000 Fujita et al. .......... 714/784

FOREIGN PATENT DOCUMENTS

DE 341004 A * 8/1992 .......... H04L/00/00

OTHER PUBLICATIONS

Youzhi Xu; Maximum likelihood erasure decoding scheme for concatenated codes; Communications, Speech and Vision, IEE Proceedings I , vol.: 139 , Issue: 3 , Jun. 1992 pp.: 336–339.*

Berlekamp, E.; Bit–serial Reed–Solomon encoders; Information Theory, IEEE Transactions on , vol.: 28 , Issue: 6 , Nov. 1982; pp. 869–874.*

Justesen, J.; On the complexity of decoding Reed–Solomon codes (Corresp.); Information Theory, IEEE Transactions on , vol.: 22 , Issue: 2 , Mar. 1976; pp.: 237–238.*

Eric W. Weisstein. "Vandermonde Matrix." From MathWorld—A Wolfram Web Resource. http://mathworld.wolfram.com/VandermondeMatrix.html.*

Eric W. Weisstein. "Hankel Matrix." From MathWorld—A Wolfram Web Resource. http://mathworld.wolfram.com/HankelMatrix.html.*

* cited by examiner

*Primary Examiner*—R. Stephen Dildine
(74) *Attorney, Agent, or Firm*—Abdul Zindani; W. James Brady, III; Frederick J. Telecky, Jr.

(57) ABSTRACT

In a Reed-Solomon decoder, error magnitudes are determined from a root matrix and a syndrome vector. The root matrix is triangularized (60) using recursive calculations. The syndrome vector is adjusted to the triangulization (62) by recursive calculations. The error magnitudes are then determined through substitution (64).

18 Claims, 3 Drawing Sheets

| n | 1 | 2 | 3 |
|---|---|---|---|
| V1 | {A1 A2 A3} | {X A2 A3} | {X X A3} |
| V(n−1) | – | {X A2 A3} | {X X A3(A1+A3)} |
| $R(A(n-1)_{v-n+1})$ | | {X A1 A1} | {X X A2} |
| $V1+R(A(n-1)_{v-n+1})$ | | {X A1+A2 A1+A3} | {X X A2+A3} |
| $(V1+R(A(n-1)_{v-n+1})*V(n-1)$ | | {0 A2(A1+A2) A3(A1+A3)} | {0 0 A3(A1+A3)(A2+A3)} |

| n | 0 | 1 | 2 | 3 |
|---|---|---|---|---|
| T(n-1) | - | {1} | {1 A1} | {1 A1+A2 A1A2} |
| $R(A(n))_n$ | - | {A1} | {A2 A2} | {A3 A3 A3} |
| $R(A(n))_n*T(n-1)$ | - | {A1} | {A2 A1A2} | {A3 A3(A1+A2) A1A2A3} |
| T(n-1)<<1 | - | {1 0} | {1 A1 0} | {1 A1+A2 A1A2 0} |
| T(n) | {1} | {1 A1} | {1 A2+A1 A1A2} | {1 A1+A2+A3 A1A3+A2A3+A1A2 A1A2A3} |

| n | 0 | 1 | 2 | 3 |
|---|---|---|---|---|
| {E} | - | {E1} | {E2 E1} | {E3 E2 E1} |
| U(n) | - | {E1} | {E2 A1E1} | {E3 E2A1+E2A2 E1A1A2} |
| W[n] | - | E1 | E2+A1E1 | E3+E2A1+E2A2+E1A1A2=E3+E2A1+A2(E2+E1A1) |

METHOD AND APPARATUS FOR COMPUTING REED-SOLOMON ERROR MAGNITUDES

CROSS-REFERENCE TO RELATED APPLICATIONS

Not Applicable

STATEMENT OF FEDERALLY SPONSORED RESEARCH OR DEVELOPMENT

Not Applicable

BACKGROUND OF THE INVENTION

1. Technical Field

This invention relates in general to error correction coding and, more particularly, to an improved Reed-Solomon decoder.

2. Description of the Related Art

Modern digital communication systems typically make use of error correction coding (ECC) schemes to improve system performance under imperfect conditions. For digital magnetic storage devices, for example, signals on the magnetic medium may degrade over time, or imperfections in the magnetic medium may cause recording errors. For optical storage devices, such as compact disks (CDs) and digital video devices (DVDs), physical wear and tear may result in misreading data. In both these cases, some errors can be correct through the use of a proper ECC scheme.

Perhaps more importantly, in digital communication systems, such as satellite communications, mobile phones, smart phones, mobile processing systems, and high-speed modems, errors can be introduced through the transmission medium. For clear, error-free transmissions, it is important to have a robust ECC scheme.

Reed-Solomon error correcting codes are used throughout the electronics industry to provide error correction, largely because of their relative simplicity of implementation and their ability to detect and correct multiple errors, especially for channels subject to burst errors. Because, Reed-Solomon error correction is word-based, a single error encompasses any or all errors within a single word, as opposed to other correction techniques in which each bit error is an independent error event.

Nonetheless, the increasing speeds of data transmission require increase speeds for error correction. Reed-Solomon error correction involves complicated matrix operations that must be performed in real time in most cases. In many devices, it is desirable to perform the Reed-Solomon error correction within a programmable processing device, such as a DSP (digital signal processor). Accordingly, techniques for improving the speed in which the matrix calculations can be performed are extremely valuable.

Therefore, a need has arisen for providing an improved Reed-Solomon decoder.

BRIEF SUMMARY OF THE INVENTION

In the present invention, for Reed-Solomon decoding, vector of $\upsilon$ syndromes $E_i$ and $\upsilon$ error locations $l_j$ are determined from a received codeword, and error magnitudes $e_{l_j}$ at the $\upsilon$ error locations can be determined from the equation $$E_i = \sum_{j=1}^{v} e_{l_j} a^{il_j},$$

where a is a primitive of the codeword. Error magnitudes are determined by triangularizing a $\upsilon\times\upsilon$ Vandermonde matrix of the elements $a^{il_j}$ to generate elements of a matrix V, generating a syndrome vector W of syndromes $E_i$, adjusted for the triangularization of matrix V, and generating a solution to an equation of a form Vx M=W, where M is a vector of the error magnitudes $e_{l_j}$ and Vx is a vector of matrix V, having a single unknown error magnitude. Substitution is used to create other equations of the form Vx M=W having a single unknown that can be solved for a respective error magnitude.

BRIEF DESCRIPTION OF THE SEVERAL VIEWS OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The present invention is best understood in relation to FIGS. 1–5 of the drawings, like numerals being used for like elements of the various drawings.

Figure 1:
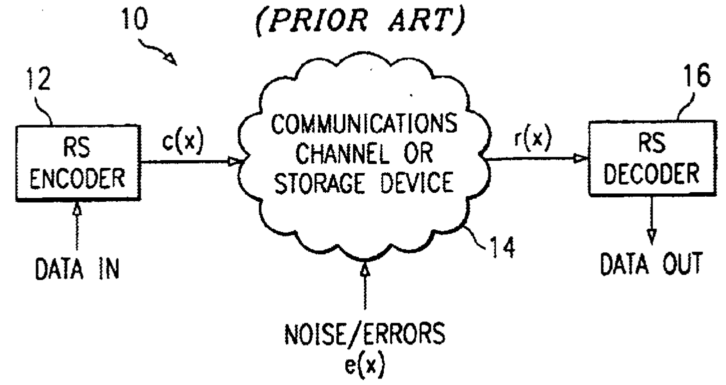
FIG. 1 illustrates a general Reed-Solomon error correction system as known in the prior art.

FIG. 1 illustrates a block diagram of a system 10 using Reed-Solomon error correcting codes. Data is input to a Reed-Solomon encoder 12. The encoder 12 receives data blocks having k symbols of s bits per symbol and adds 2t parity symbols to result in a codeword of n=k+2t symbols. The maximum codeword length for a Reed-Solomon code is $n=2^s-1$. Thus, using 8-bit (byte) symbols, the maximum code length is 255 bytes. The degree of error protection can be managed by allocating the number of data symbols (k) and number of parity symbols (2t) within the codeword. A Reed-Solomon decoder can correct up to t symbols that contain errors.

Reed-Solomon codes are generated using a polynomial of the form:

$g(x)=(x-a^0)(x-a^1)(x-a^2)\ldots(x-a^{2t-1})$, where a is referred to as a "primitive", and the codeword is generated as:

c(x)=g(x) i(x), where i(x) is the data block.

The encoded data, c(x), is transferred through, or to, a medium 14, such as a communication channel or a storage medium. At this point, noise or other errors, e(x), may enter the encoded data stream. The data stream received at the Reed-Solomon decoder 16 is thus r(x)=c(x)+e(x). The Reed-Solomon decoder 16 decodes the data and corrects errors.

Figure 2:
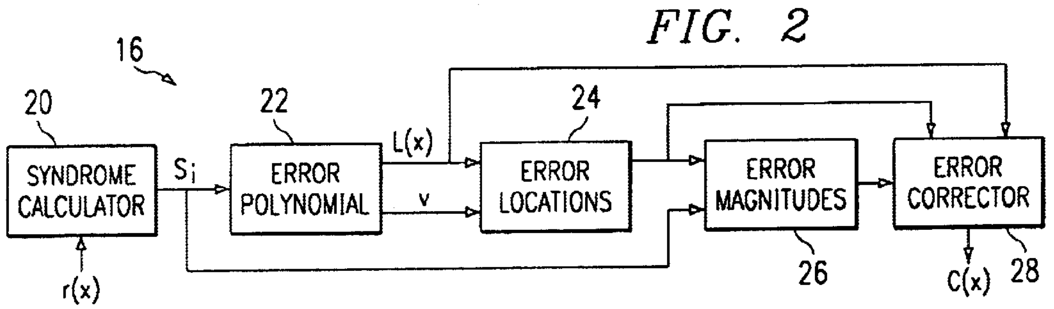
FIG. 2 illustrates a block diagram of a Reed-Solomon decoder.

FIG. 2 illustrates a general block diagram of a Reed-Solomon decoder 16. These blocks could be implemented in hardware or in a programmable processor such as a DSP (digital signal processor). The first block is a syndrome calculator 20. The syndrome calculator 20 determines whether there are any errors in the received code word r(x). Since the codeword is generated through multiplication with the generator polynomial, if the received code word is error free then its modulus with respect to the generator polynomial should evaluate to zero. If, on the other hand, the remainder is non-zero, there are errors in the received codeword. The remainder is called the syndrome.

The syndrome calculator 20 calculates the 2t known coefficients of the Fourier transform E(x) from the received message. These are known as the "syndrome coefficients" and denoted $S_t$.

The next block is the error locator polynomial 22. The error locator polynomial has roots that give the error locations. The two most popular methods of finding the error locater polynomial are Euclid's Algorithm and the Berlekamp-Massey Algorithm.

The next block is the error locations block 24. In this block, using the error location polynomial from block 22, the roots of the error location polynomial are determined, typically using a Chien search.

The next block is the error magnitudes block 26. At this point, the location of the errors is known, but not the errors themselves. The syndromes and the error polynomial roots are used to derive the error values. In the prior art, this is typically accomplished using the Forney method. The present invention presents a different method of computing the error magnitudes that improves performance.

The final block is the error correction block 28. After the error magnitudes block 26, the error polynomial e(x) is known completely and can be subtracted from the received polynomial r(x) to yield the codeword c(x).

It should be noted that Reed Solomon structures use Galois arithmetic. Some DSPs (digital signal processors) perform Galois operations directly, while others can be programmed to implement Galois arithmetic.

The error magnitude block solves the equation:

$$E_i = \sum_{j=1}^{v} e_{l_i} a^{il_j},$$

where υ is the number of errors, $l_j$ are the error locations, $e_{l_j}$ are the error magnitudes, and $E_i$ are the syndromes. This is a system of υ linear equations with υ unknowns—the values of the υ coefficients at the known error locations. In matrix form, it can be described as:

$$\begin{bmatrix} a^{1l_1} & \cdots & a^{1l_v} \\ \vdots & \ddots & \vdots \\ a^{vl_1} & \cdots & a^{vl_v} \end{bmatrix} \begin{bmatrix} e_{l_1} \\ \vdots \\ e_{l_v} \end{bmatrix} = \begin{bmatrix} E_1 \\ \vdots \\ E_v \end{bmatrix} \tag{1}$$

The equation set forth above is the commonly used matrix equation for solving for e(x). The method set forth below provides an efficient way of solving the matrix equation, which can be particularly useful for software implementations using a DSP.

For simplification, the notation Ax is used in place of $a^{l_v}$; hence the first matrix (the error polynomial coefficient matrix) in equation (1) can be rewritten as:

$$\begin{bmatrix} A1^1 & A2^1 & \cdots & Av^1 \\ A1^2 & A2^2 & \cdots & Av^2 \\ \vdots & \vdots & \ddots & \vdots \\ A1^v & A2^v & \cdots & Av^v \end{bmatrix}$$

This υ×υ matrix is a Vandermonde matrix and can be efficiently triangularized by the methods discussed below. By triangularizing this matrix, the determination of the error magnitudes can be simplified. In this case, an upper triangular matrix is shown, but a lower triangular matrix can be used as well. The triangularized matrix for υ=4 is:

$$\begin{bmatrix} A1 & A2 & A3 & A4 \\ & A2(A2+A1) & A3(A3+A1) & A4(A4+A1) \\ & & A3(A3+A1)(A3+A2) & A4(A4+A1)(A4+A2) \\ & & & A4(A4+A1)(A4+A2)(A4+A3) \end{bmatrix}$$

The triangularization of the error polynomial coefficient matrix requires 1+2+3+ . . . +(v−1) (Galois) multiplications and 1+2+3+ . . . +(v−1) (Galois) additions. To preserve the equation, the same operation are performed on the other side of equation (1); hence the syndrome vector is rewritten as:

$$\begin{bmatrix} E1 \\ E2 + A1*E1 \\ E3 + A1*E2 + A2*(E2 + A1*E1) \\ E4 + A1*E3 + A2*(E3 + A1*E2) + A3(E3 + A1*E2 + A2*(E2 + A1*E1)) \end{bmatrix}$$

These computations can also be done using 1+2+3+ . . . +(υ−1) multiplications and the same number of additions.

Once triangularized matrixes are formed, the equations can be solved with relative ease. Solving at the last row (first row for a lower triangular matrix) of the error polynomial coefficient matrix yields an equation with one unknown, namely (for the 4×4 matrix example):

$$A4(A4+A1)(A4+A2)(A4+A3)e_{l_v} = E4 + A1*E3 + A2*(E3+A1*E2) + A3(E3+A1*E2+A2*(E2+A1*E1)).$$

The equation is easily solved for $e_{l_v}$:

$$e_{l_v} = \frac{E4 + A1*E3 + A2*(E3+A1*E2) + A3(E3+A1*E2+A2*(E2+A1*E1))}{A4(A4+A1)(A4+A2)(A4+A3)}$$

The next row of the matrix equation can be solved for $e_{l_{v-1}}$, as there will be only one unknown, since the value of $e_{l_v}$ is now known. By back-substituting (using the solutions to create additional equations with a single unknown), each error magnitude can be solved as an equation of a single unknown. The computation of all the error magnitudes would require υ divisions, (υ−1)+(υ−2)+ . . . +1 multiplications and the same number of additions. Hence, the number of operation in computing the error magnitudes using matrix techniques is proportional to $υ^2$, as it is in the Forney method.

A more generalized implementation of the triangularization techniques are now described. In the following discussion, $R(Ax)_z$ indicates a replicate function, found on some DSPs as a native command that replicates a scalar across a vector z times. Hence $R(A1)_3$ would yield [A1 A1 A1]. Further, the vector multiplication and addition is element-by-element; hence if V1=[A1 A2 A3] and V2=[A3 A2 A1], then V1*V2=[A1A3 A2A2 A3A1]. Likewise V1+V2=[A1+A3 A2+A2 A3+A1].

The υxυ error polynomial coefficient matrix can be triangularized using the formula $Vn=(V(n-1)+R(A(n-1))_{υ-n+1})*V(n-1)$ with V1 being the vector of the top row of the matrix and Vv being the vector of the bottom row of the matrix.

V1={A1 A2 A3 . . . Av}

$V2=(V1+R(A1))*V1$ $V3=(V1+R(A2))*V2$ $V4=(V1+R(A3))*V3$

. . .

$Vv=(V1+R(Av)_{υ-n+1})\cdot V(v-1)$

Figure 3A:
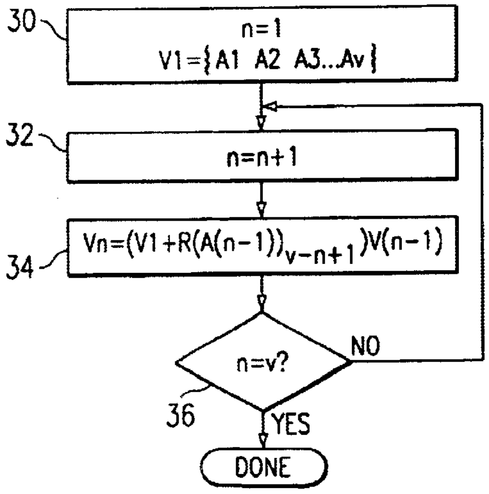
FIG. 3*a* illustrates a flow chart describing a preferred embodiment of triangularizing a root matrix.
Figures 3B, 5:
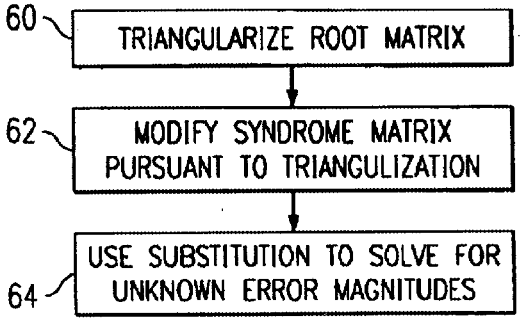
FIG. 3*b* illustrates a table showing the results of the operation of FIG. 3*a* for a 3×3 matrix.
FIG. 5 illustrates a block diagram showing the overall calculation of the error magnitudes.

FIG. 3*a* illustrates a flowchart showing the computations for the triangularized error polynomial coefficient matrix. In step 30, the top row of the error polynomial coefficient matrix is defined as {A1 A2 A3 . . . Av}. The index, n, is set to “1”. In block 32, the index n is incremented and in block 34, the next row of the error polynomial coefficient matrix is computed as $Vn=(V(n-1)+R(A(n-1))_{υ-n+1})*V(n-1)$. Steps 32 and 34 are repeated until the final row (n=υ) is computed in decision block 36. As can be seen, the computation of the triangular matrix is structured such that the previous row (V(n−1)) is multiplied (element-by-element) by V1+R(A(n−1). Accordingly, a minimum of calculations are performed to compute each successive row. FIG. 3*b* illustrates a table showing the calculation of elements for a 3×3 error polynomial coefficient matrix. In the table an “X” represents a “don’t care” for elements of the triangular matrix that will be set to zero.

On a DSP, such as the TEXAS INSTRUMENTS C6XHP family of processors, computing each successive vector would take two instruction cycles. Triangularizing an 8×8 matrix, therefore, would take about 16 cycles.

The operations performed on the syndrome vector can be described as follows:

$$T0 = \{1\}$$

$$T1 = (R(A1))_1 * T0 + T0 \ll 1,\ U1 = T0*\{E1\},\ W[1] = \text{sum}(U1)$$

$$T1 = R(A2)_2 * T1 + T1 \ll 1,\ U2 = T1*\{E2\ E1\},\ W[2] = \text{sum}(U2)$$

$$\ldots$$

$$T(n) = R(A(n))_n * T(n-1) + T(n-1) \ll 1,\ U(n) = T(n-1)*\{E(n)\ E(n-1) \ldots E1\},\ W[n] = \text{sum}(U(n))$$

where T(n−1)<<1 is the previous value of T, left-shifted and right-filled with a “0”. In the addition of $R(A(n))_n*T(n-1)+T(n-1)<<1$, the value of $R(A(n))_n*T(n-1)$ is left-filled with a “0” so that the vectors are the same size. Once again, additions and multiplications between vectors are element-by-element. Sum(U(n)) is the sum of all elements of U(n).

Figures 4A, 4B, 4C:
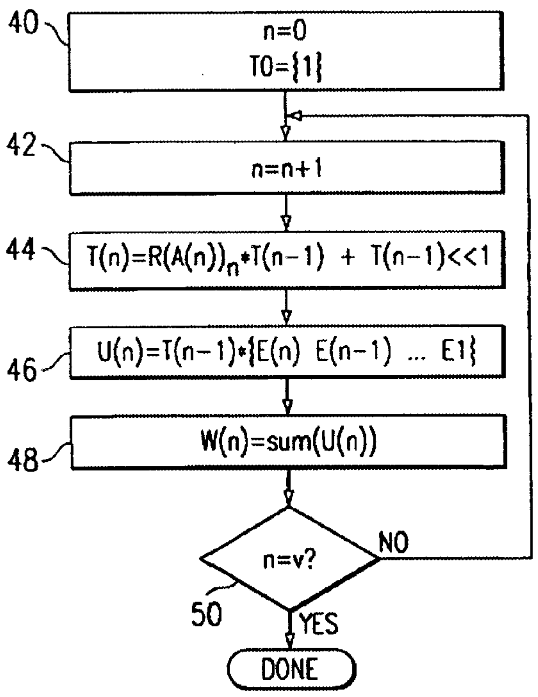
FIG. 4*a* illustrates a flow chart describing a preferred embodiment of adjusting a syndrome vector pursuant to triangularizing the root matrix.
FIGS. 4*b* and 4*c* illustrates a table showing the results of the operation of FIG. 4*a* for a 1×3 matrix.

FIG. 4*a* illustrates a flow chart describing the recursive calculation of the syndrome vector. In step 40, the index n is set to “0” and an initial vector T0 is defined. In step 42, the index is incremented and in step 44, T(n) is defined as $T(n)=R(A(n))_n*T(n-1)+T(n-1)<<1$. For T1 (i.e., n=1), this calculation would be equivalent to {A1}*{1}+{1 0}. Therefore, T1={1 A1}. In step 46, U(n) is calculated as U(n)=T(n−1)*{E(n) E(n−1) . . . E1}. For n=1, U(n)={1}{E1}={E1}. In step 48, W(n) is calculated as W(n)=sum (U(n)). For n=1, U(n)=E1. The modified syndrome vector is set to:

$$\begin{bmatrix} W1 \\ \vdots \\ Wv \end{bmatrix}$$

Decision block 50 repeats steps 42 through 48, until all elements of the modified syndrome vector are calculated. As can be seen, each element is calculated from a previous T vectors in steps 44 and 46.

For n=2, the new value of T is calculated as the previous value of T−{1 A1}−multiplied element-by-element with {A2 A2} to render {A2 A1A2}. This is added to the left-shifted T(n−1)−{1 A1 0} to render {1 A1+A2 A1A2}. U2 is calculated as {1 A1} multiplied by {E2 E1} to render {E2 A1E1}. Hence, W2=E2+A1E1. FIGS. 4*b* and 4*c* illustrate the calculations for a 1×3 matrix.

On a modern DSP, such as the C6XHP family of processors, computing each successive T and U vector takes two instruction cycles (two shifts, two XORs, four GF(256) multiplies, and two replicates). Computing W[2] would take a shift and an add, W[3] and W[4] would take two shifts and two adds each, and W[5–8] would take two shifts and three adds each. Thus for a 1×8 matrix, about 8 instruction cycles would be required to compute the W vector from the U values. Including the time to compute the T and U vectors, about 24 instruction cycles would be required to compute the W vector.

FIG. 5 illustrates a flow chart describing overall operation of the error magnitudes block 26. In step 60, the error polynomial coefficient matrix is triangularized, preferably using recursive calculations as shown in connection with FIG. 3*a*. In block 62, the syndrome vector is modified pursuant to the changes made in the error polynomial coefficient matrix.

In block 64, the error magnitudes are calculated by substitution. The kernel execution time for back-substitution would be about six instruction cycles per iteration. The operations would be:

(1) load reciprocal of diagonal element of triangularized error polynomial coefficient matrix;

(2–5) pack column of triangularized matrix into a vector;

(6–7) multiply element of W vector by reciprocal (gives error magnitude);

(8) replicate error magnitude;

(9–10) multiply column vector by error magnitude;

(11) add product vector to W vector.

Another iteration of step 6 cannot be started until step 11 is complete; however, the loading of a reciprocal and packing of a column into a vector can be started prior to step 11 to conserve time. The execution time of back-substitution would be about forty-eight instruction cycles for an 8×8 error polynomial coefficient matrix.

The worst-case execution time of finding the error magnitudes on a C6XHP or similar processor would be about 88 (16+24+48) instruction cycles. This could probably be reduced by specific coding for vectors that mostly contain zeroes.

The present invention provides an alternative method for the Forney method of calculating error magnitudes. On modern DSPs, the present invention can provide increased speed in the calculation. Whereas the Forney method operates on scalars, the present invention operates on vectors to take better advantage of hardware that computes several Galois field at a time. As processors are able to operate on larger Galois field vectors, the savings in execution time using the present invention increases.

Although the Detailed Description of the invention has been directed to certain exemplary embodiments, various modifications of these embodiments, as well as alternative embodiments, will be suggested to those skilled in the art. The invention encompasses any modifications or alternative embodiments that fall within the scope of the Claims.

What is claimed is:

1. A method of determining error magnitudes in Reed-Solomon decoding, wherein a vector of v syndromes $E_i$ and v error locations $l_j$ are determined from a received codeword, and error magnitudes $e_{l_j}$ at the v error locations can be determined from the equation $$E_l = \sum_{j=1}^{v} e_{l_j} a^{il_j},$$

where a is a primitive of the codeword, comprising the steps of:

triangularizing a v×v Vandermonde matrix of the elements $a^{il_j}$ to generate elements of a matrix V;

generating a syndrome vector W of syndromes $E_i$, adjusted for the triangularization of matrix V;

generating a solution to an equation of a form Vx M=W, where M is a vector of the error magnitudes $e_{l_j}$ and Vx is a vector of matrix V, having a single unknown error magnitude;

substituting to create other equations of the form Vx M=W having a single unknown that can be solved for a respective error magnitude.

2. The method of claim 1 wherein said triangularizing step comprises the step of recursively generating vectors of V.

3. The method of claim 2 wherein said recursively generating step comprises the steps of:

setting a first vector V(1) of matrix V; and generating subsequent vectors n, 2≦n≦v, as:

$$V(n)=(V(1)+R(A(n-1))_{v-n+1})V(n-1)$$

where A(n) is equal to $a^{l_n}$ and $R(A(n))_m$ is a vector having A(n) replicated m times.

4. The method of claim 3 wherein said step of setting the first vector comprises setting the first vector V(1) to {A(1) A(2) . . . A(v)}.

5. The method of claim 1 wherein said step of generating a syndrome vector comprises the step of recursively generating elements of W.

6. The method of claim 5 wherein said step of recursively generating elements of W comprises the steps of:

for each element W(n):

generating a vector $T(n)=R(A(n))_n*T(n-1)+T(n-1)<<1$, where $R(A(n))_m$ is a vector having A(n) replicated m times and is T(n−1)<<1 is a previous value of T, left-shifted and right-filled with a “0”;

generating a vector U(n)=T(n−1)*{E(n) E(n−1) . . . E1} and computing W(n) as the sum of the elements of U(n).

7. A method of Reed-Solomon decoding, comprising the steps of:

generating a vector of v syndromes $E_i$ from a received codeword;

generating v error locations $l_j$ from the received codeword, determining error magnitudes $e_{l_j}$ at the v error locations from the equation $$E_l = \sum_{j=1}^{v} e_{l_j} a^{il_j},$$

where a is a primitive of the codeword by:

triangularizing a v×v Vandermonde matrix of the elements $a^{il_j}$ to generate elements of a matrix V;

generating a syndrome vector W of syndromes $E_i$, adjusted for the triangularization of matrix V;

generating a solution to an equation of a form Vx M=W, where M is a vector of the error magnitudes $e_{l_j}$ and Vx is a vector of matrix V, having a single unknown error magnitude;

substituting to create other equations of the form Vx M=W having a single unknown that can be solved for a respective error magnitude.

8. The method of claim 7 wherein said triangularizing step comprises the step of recursively generating vectors of V.

9. The method of claim 8 wherein said recursively generating step comprises the steps of:

setting a first vector V(1) of matrix V; and generating subsequent vectors n, 2≦n≦v, as:

$$V(n)=(V(1)+R(A(n-1))_{v-n+1})V(n-1)$$

where A(n) is equal to $a^{l_n}$ and $R(A(n))_m$ is a vector having A(n) replicated m times.

10. The method of claim 9 wherein said step of setting the first vector comprises setting the first vector V(1) to {A(1) A(2) . . . A(v)}.

11. The method of claim 7 wherein said step of generating a syndrome vector comprises the step of recursively generating elements of W.

12. The method of claim 7 wherein said step of recursively generating elements of W comprises the steps of:
for each element W(n):
generating a vector T(n)=R(A(n))$_n$*T(n−1)+T(n−1)<<1, where R(A(n))$_m$ is a vector having A(n) replicated m times and is T(n−1)<<1 is a previous value of T, left-shifted and right-filled with a "0";
generating a vector U(n)=T(n−1)*{E(n) E(n−1) . . . E1} and
computing W(n) as the sum of the elements of U(n).

13. A Reed-Solomon decoder comprising:
circuitry for generating a vector of v syndromes E$_i$ from a received codeword;
circuitry for generating v error locations l$_j$ from the received codeword,
circuitry for determining error magnitudes e$_{l_j}$ at the v error locations from the equation $$E_l = \sum_{j=1}^{v} e_{l_j} a^{il_j},$$

where a is a primitive of the codeword by the operations of:
triangularizing a v×v Vandermonde matrix of the elements $a^{il_j}$ to generate elements of a matrix V;
generating a syndrome vector W of syndromes E$_i$, adjusted for the triangularization of matrix V;
generating a solution to an equation of a form Vx M=W, where M is a vector of the error magnitudes e$_{l_j}$ and Vx is a vector of matrix V, having a single unknown error magnitude;
substituting to create other equations of the form Vx M=W having a single unknown that can be solved for a respective error magnitude.

14. The Reed-Solomon decoder of claim 13 wherein said circuitry for determining error magnitudes comprises circuitry for recursively generating vectors of V.

15. The Reed-Solomon decoder of claim 14 wherein said circuitry for recursively generating vectors comprises circuitry for:
setting a first vector V(1) of matrix V; and
generating subsequent vectors n, 2≦n≦v, as:

$$V(n)=(V(1)+R(A(n-1))_{v-n+1})V(n-1)$$

where A(n) is equal to $a^{l_n}$ and R(A(n))$_m$ is a vector having A(n) replicated m times.

16. The Reed-Solomon decoder of claim 15 wherein said circuitry for determining error magnitudes sets the first vector V(1) to {A(1) A(2) . . . A(v)}.

17. The Reed-Solomon decoder of claim 13 wherein said circuitry for determining error magnitudes generates a syndrome vector by recursively generating elements of W.

18. The Reed-Solomon decoder of claim 13 wherein said circuitry for generating error magnitudes recursively generates elements of W by:
for each element W(n):
generating a vector T(n)=R(A(n))$_n$*T(n−1)+T(n−1)<<1, where R(A(n))$_m$ is a vector having A(n) replicated m times and is T(n−1)<<1 is a previous value of T, left-shifted and right-filled with a "0";
generating a vector U(n)=(n−1)*{E(n) E(n−1) . . . E1} and
computing W(n) as the sum of the elements of U(n).

* * * * *